United States Patent [19]

Bader

[11] Patent Number: 5,321,746

[45] Date of Patent: Jun. 14, 1994

[54] ADJUSTABLE GAIN RANGE CURRENT MIRROR

[75] Inventor: Scott K. Bader, Mesa, Ariz.

[73] Assignee: Motorola, Inc., Schaumburg, Ill.

[21] Appl. No.: 662,145

[22] Filed: Feb. 28, 1991

[51] Int. Cl.$^5$ .................. H04M 1/02; H03G 3/30

[52] U.S. Cl. .................. 379/390; 330/284; 330/288

[58] Field of Search .............. 379/387, 388, 389, 390, 379/347, 420; 330/284, 288; 307/552-554

[56] References Cited

U.S. PATENT DOCUMENTS

| | | | |
|---|---|---|---|
| 4,259,642 | 3/1981 | Derby | 330/288 |
| 4,720,856 | 1/1988 | Pace et al. | 379/390 |

FOREIGN PATENT DOCUMENTS

| | | | |
|---|---|---|---|
| 151806 | 11/1980 | Japan | 330/288 |
| 61348 | 4/1984 | Japan | 379/390 |

*Primary Examiner*—James B. Mullins
*Attorney, Agent, or Firm*—Michael D. Bingham; Bradley J. Botsch, Sr.

[57] ABSTRACT

A speakerphone with a varying gain current mirror circuit is provided. The varying gain current mirror circuit is within the DC control loop of the speakerphone such that by varying the gain of the current mirror circuit, the attenuation range of the speakerphone is correspondingly varied.

11 Claims, 7 Drawing Sheets

1

ADJUSTABLE GAIN RANGE CURRENT MIRROR

BACKGROUND OF THE INVENTION

The present invention relates to current mirrors, for example, an adjustable gain range current mirror for a speakerphone system.

Current half duplex speakerphones include complementary attenuators, a transmit attenuator and a receive attenuator to control the gain in the transmit and receive paths. The gain of each path is determined by the relative strength of the signal appearing in each path. Typical half duplex speakerphones utilize a control circuit which provides a DC feedback loop to actively maintain the proper control voltages on each of the complementary attenuators such that the minimum and maximum gains (the attenuation range) of the complementary attenuators are substantially constant. Further, the difference between the minimum and maximum gains of the complimentary attenuators, which is also known as the attenuation range, is important to the overall stability of the speakerphone wherein a large attenuation range is necessary for speakerphone systems with poor sidetone or high acoustic coupling. However, for speakerphone systems with good sidetone and/or low acoustic coupling, less attenuation range is required. Furthermore, less attenuation range allows the speakerphone to switch between transmit and receive modes faster thereby better approximating a full duplex operation.

Hence, a need exists for a speakerphone system having an attenuation range control circuit which provides a plurality of gain ranges.

SUMMARY OF THE INVENTION

Briefly, there is provided a circuit having an input signal applied at an input thereof and an output signal provided at an output thereof comprising a plurality of current mirrors, each one of the plurality of current mirrors having an input terminal, an output terminal and a reference terminal, the input terminals of each one of the plurality of current mirrors being coupled to the input of the circuit, the output terminals of each one of the plurality of current mirrors being coupled to the output of the circuit; and a control circuit, coupled to the reference terminals of each one of the plurality of current mirrors, for alternately rendering each one of the plurality of current mirrors operative, each one of the plurality of current mirrors providing a predetermined gain of the output signal with respect to the input signal.

It is an advantage of the present invention to provide a speakerphone having a plurality of attenuation ranges. It is also an advantage of the present invention to provide a digital volume control for a speakerphone.

The above and other advantages and features of the present invention will be better understood from the following detailed description taken in conjunction with the accompanying drawings.

DETAILED DESCRIPTION OF THE INVENTION

Figure 1:
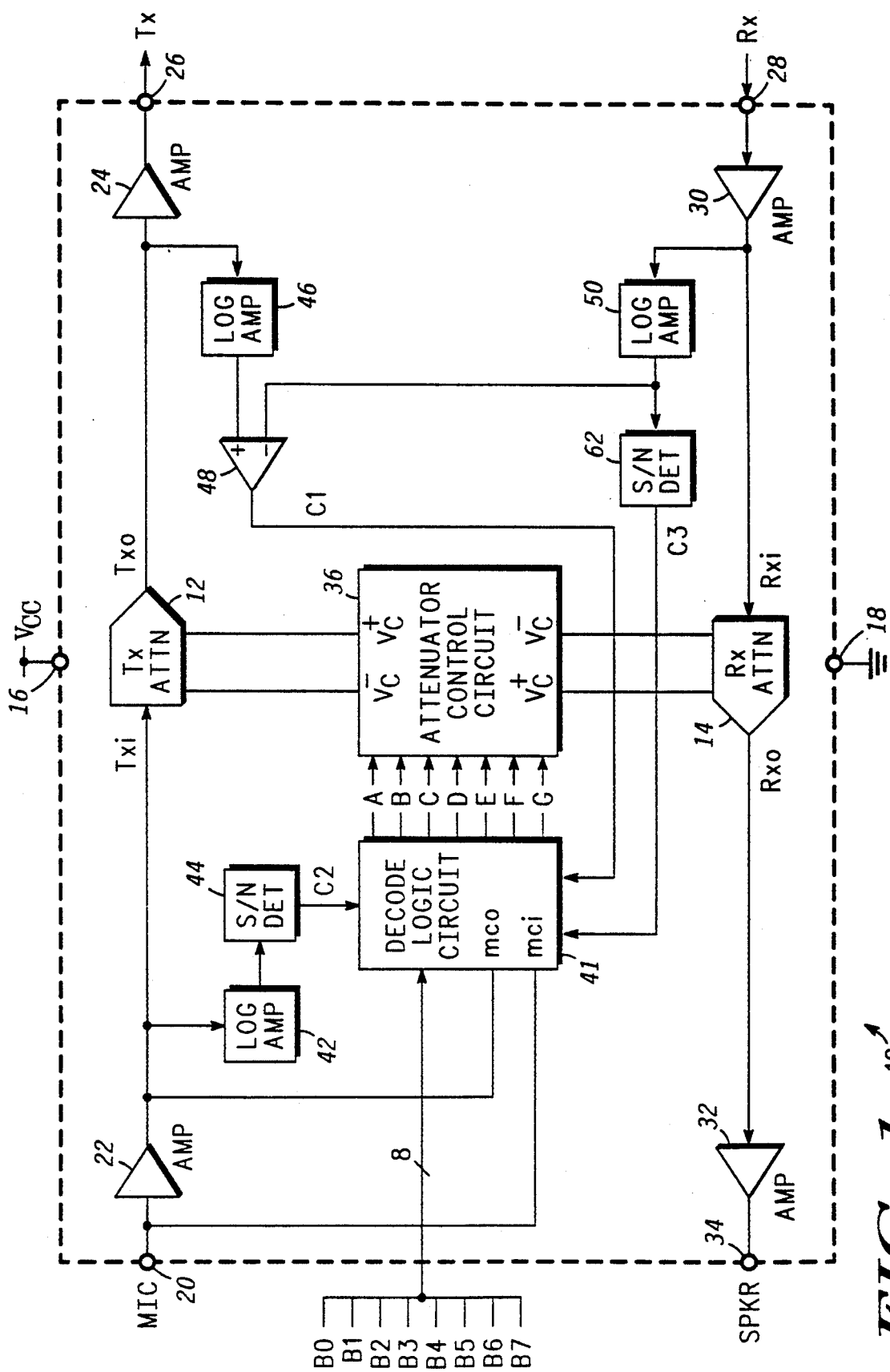
FIG. 1 is a simplified partial block diagram illustrating a speakerphone.

Referring to FIG. 1, there is illustrated a simplified partial block diagram of integrated speakerphone circuit 10 of the present invention. Speakerphone circuit 10 is voice-switched between a transmit (Tx) and a receive (Rx) mode in a half-duplex, hands free operation. Half-duplex operation is accomplished by controlling the gain/attenuation of attenuators 12 and 14. Attenuators 12 and 14 operate in a complementary manner, i.e., in response to a direct current (DC) control signal applied thereto, the gain of one attenuator is maximized while the gain of the other is minimized. Power supply voltage $V_{CC}$ is applied across terminals 16 and 18. The transmit signal path which includes transmit attenuator 12 whereby the input of transmit attenuator 12 is coupled to input terminal 20 through amplifier 22. A microphone (not shown) would be connected to terminal 20. The output of transmit attenuator 12 is coupled to the transmit output terminal 26 through amplifier 24. The receive signal path includes receive attenuator 14 coupled in series between the output of amplifier 30 and the input of amplifier 32. The input of amplifier 30 is coupled to input terminal 28 while the output of amplifier 32 is coupled to output terminal 34. Output terminal 34 would be coupled to a speaker (not shown). Further, output terminal 26 and input terminal 28 would be coupled to the telephone lines via appropriate circuitry as understood. Attenuator control circuit 36 provides control voltages $V_{C+}$ and $V_{C-}$ to vary the gains of attenuators 12 and 14 in response to logic signals a-g. Logic signals C1, C2 and C3 are decoded by decode logic circuit 41 to determine which channel, the transmit channel or the receive channel, has the largest voice signal appearing thereon and will be discussed in more detail hereinafter.

The output of amplifier 22 is sensed by logarithmic amplifier 42 and signal to noise detector 44 wherein logarithmic amplifier 42 provides a DC representation of a signal appearing at the output of amplifier 22. Signal C2 is forced to a logic high whenever the output of amplifier 22 is voice, otherwise signal C2 is a logic low. The transmit signal appearing at the output of transmit attenuator 12 is sensed via logarithmic amplifier 46 and compared with the receive signal appearing at the output amplifier 30 via logarithmic amplifier 50 wherein logarithmic amplifier 46 provides a DC representation of a signal appearing at the output of attenuator 12 while logarithmic amplifier 50 provides a DC representation of a signal appearing at the output of amplifier 30. The outputs of logarithmic amplifiers 46 and 50 are supplied to the non-inverting and inverting inputs, respectively, of comparator 48. If the DC representation of the transmit signal applied to comparator 48 is greater than the DC representation of the receive signal, then signal C1 will be forced to a logic high, otherwise signal C1 is a logic low. Further, the output of logarithmic amplifier 50 is sensed by signal to noise detector 62 to force signal C3 to a logic high whenever the output of amplifier 30 is voice, otherwise signal C3 is a logic low.

Speakerphone circuit 10 as so far described is similar to known prior art speakerphones, for instance the MC34018 speakerphone circuit manufactured by Motorola, Inc. Hence, if the near-end talker is speaking into the microphone and the far-end talker is listening, speakerphone 10 is placed in the Tx mode since signals C1 and C2 would be decoded by decode logic circuit 41 as both being in a logic high state. In the Tx mode, control voltages $V_{C+}$ and $V_{C-}$ set the gain of transmit attenuator 12 to a maximum while the attenuation of receive attenuator 14 is correspondingly set to a minimum. Similarly, in response to a receive signal applied at input 28, speakerphone circuit 10 will be placed in a Rx mode since decode logic circuit 41 decodes signal C1 as being a logic low and C3 as being a logic high. Further, if neither talker is speaking, signals C2 and C3 are detected by decode logic circuit 41 as both being a logic low and, thus, speakerphone circuit 10 is placed in an idle mode wherein control voltages $V_{C+}$ and $V_{C-}$ set the gains of attenuators 12 and 14 to be substantially equal. In the idle mode, no voice is detected on either channel, or speakerphone circuit 10 cannot determine which signal, the transmit signal or the receive signal, is stronger. Thus, speakerphone circuit 10 waits for the next person to speak to determine the mode of operation.

Decode logic circuit 41 of speakerphone circuit 10 receives input signals b0-b7 and C1-C3. In addition, the input of amplifier 22 is coupled to output mci of decode logic circuit 41 while the output of amplifier 22 is coupled to output mco of decode logic circuit 41. Outputs mci and mco are utilized to place speakerphone circuit 10 in a transmit mute mode as will be described in more detail hereinafter.

Figure 2:
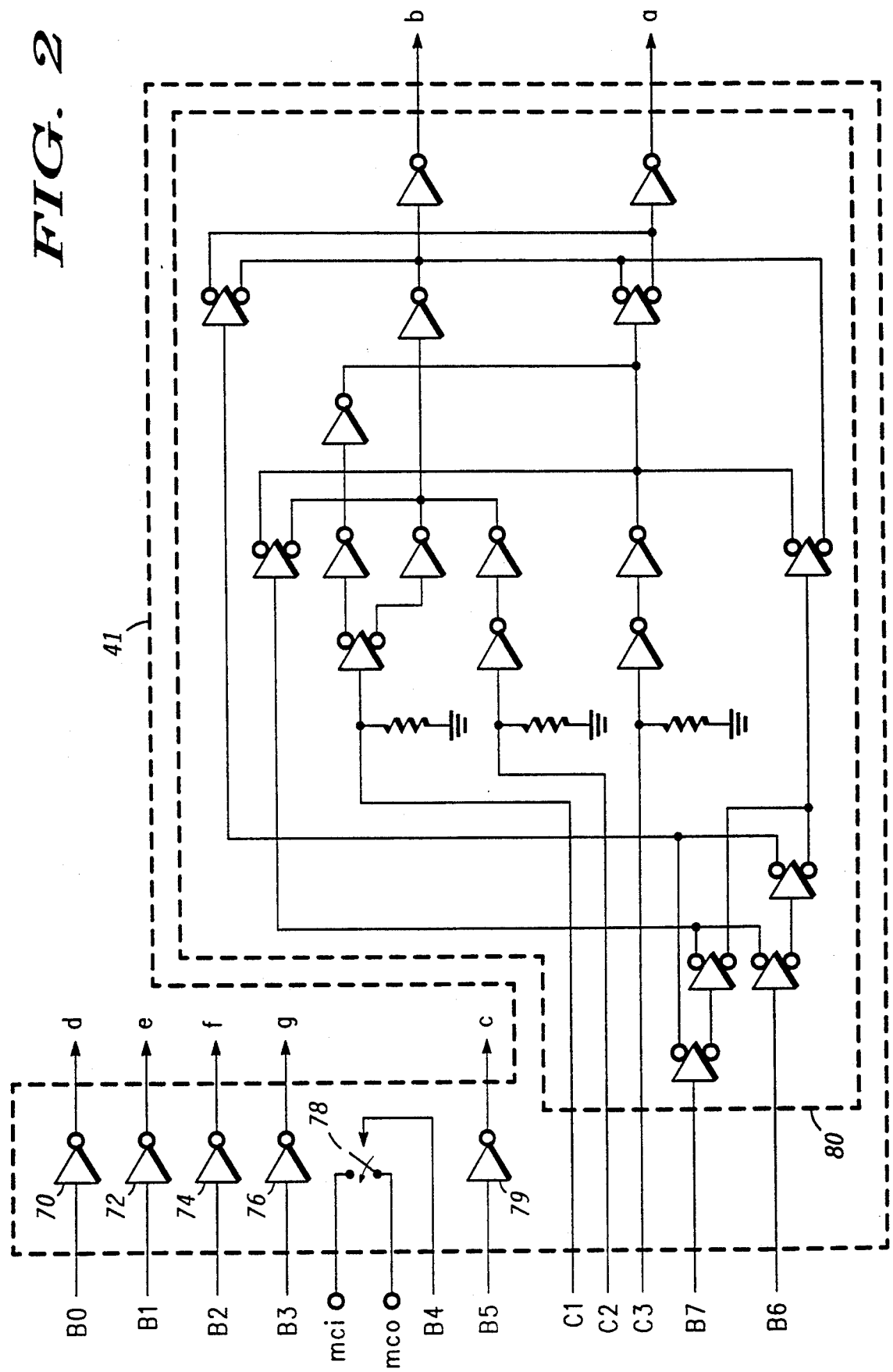
FIG. 2 is a simplified schematic diagram illustrating at least one implementation of the decode logic circuit for a speakerphone.

Referring to FIG. 2, a simplified schematic diagram illustrating at least one implementation of decode logic circuit 41 is shown. It is understood that components similar to those of FIG. 1 are designated by like reference numerals. Decode logic circuit 41 has a plurality of inputs which are coupled to receive signals b0-b7. Further, decode logic circuit 41 also has outputs mci and mco which are respectively coupled to the input and output of amplifier 22 of FIG. 1. Decode logic circuit 41 also provides output signals a-g which are supplied to attenuator control circuit 36.

Briefly, decode logic circuit 41 determines whether speakerphone circuit 10 should be placed in a transmit mode (Tx), a receive mode (Rx) or an idle mode by decoding the logic levels of inputs signals C1, C2 and C3. In addition, signals b0-b7 contain information that is decoded by decode logic circuit 41 to place speakerphone circuit 10 in other additional modes. Some of these additional modes include: forced receive mode, forced transmit mode, forced idle mode, attenuation range control and volume control.

Decode logic circuit 41 includes inverters 70, 72, 74 and 76 which have their inputs respectively coupled to receive logic signals b0-b3 and their outputs for respectively providing logic signals d-g. Thus, logic signals d-g are respectively the inversion of logic signals b0-b3 whereby logic signals b0-b3 will be utilized for digitally controlling the volume of speakerphone circuit 10 as will be described in detail hereinafter. Outputs mci and mco are coupled to first and second terminals of switch 78. Switch 78 is controlled by logic signal b4 such that if signal b4 is a logic high, switch 78 is closed thereby shorting out amplifier 22 and placing speakerphone circuit 10 in a microphone amplifier mute mode. Inverter 79 inverts input logic signal b5 to provide output logic signal c which controls the attenuation range of attenuators 12 and 14 as will be discussed in detail hereinafter. Further, logic signals C1-C3 and b6 and b7 are supplied to logic block 80 for respectively providing output logic signals a and b to attenuator control circuit 36. If signals b6 and b7 are both a logic low, then logic block 80 is responsive to the logic levels of signals C1-C3. However, if either or both of logic signals b6 and b7 are a logic high, then signals b6 and b7 will override signals C1-C3 and logic block 80 will be responsive to signals b6 and b7. It is understood that the simple logical operation of logic block 80 can be realized by one of ordinary skill in the art. Therefore, a detailed discussion of logic block 80 is not presented. However, table 1 is shown below which includes a truth table of the logical values for output signals a and b for all possible logical combinations of signals b6, b7 and C1-C3. In addition, the truth table also shows the various modes that speakerphone circuit 10 is placed in with respect to each logic combination.

TABLE 1

TRUTH TABLE FOR LOGIC BLOCK 80

| INPUT SIGNALS | | | | | OUTPUT SIGNALS | | |
|---|---|---|---|---|---|---|---|
| b6 | b7 | C1 | C2 | C3 | a | b | MODE |
| 0 | 0 | 0 | 0 | 0 | 0 | 0 | idle |
| 0 | 0 | 0 | 0 | 1 | 1 | 1 | Rx |
| 0 | 0 | 0 | 1 | 0 | 0 | 0 | idle |
| 0 | 0 | 0 | 1 | 1 | 1 | 1 | Rx |
| 0 | 0 | 1 | 0 | 0 | 0 | 0 | idle |
| 0 | 0 | 1 | 0 | 1 | 0 | 0 | idle |
| 0 | 0 | 1 | 1 | 0 | 0 | 1 | Tx |
| 0 | 0 | 1 | 1 | 1 | 0 | 1 | Tx |
| 0 | 1 | x | x | x | 1 | 1 | Forced Rx |
| 1 | 0 | x | x | x | 0 | 0 | Forced idle |
| 1 | 1 | x | x | x | 0 | 1 | Forced Tx | where "x" represents a don't care logic level;
"Rx" stands for receive; and
"Tx" stands for transmit.

The truth table reveals that in normal operation of speakerphone circuit 10 (b6=b7=logic low), there are four logical combinations of C1-C3 where speakerphone circuit 10 cannot determine whether the transmit signal or the receive signal is dominant. Therefore, speakerphone circuit 10 is placed in an idle mode and waits for the next speaker. In addition, the truth table reveals that speakerphone circuit 10 may be placed in a "forced" receive, transmit or idle mode by logic signals b6 and b7 wherein if either or both of logic signals b6 and b7 are a logic high, then logic signals b6 and b7 override logic signals C1-C3. It is understood that decode logic circuit 41 is only one circuit to implement the logic shown in Table 1.

Figure 3:
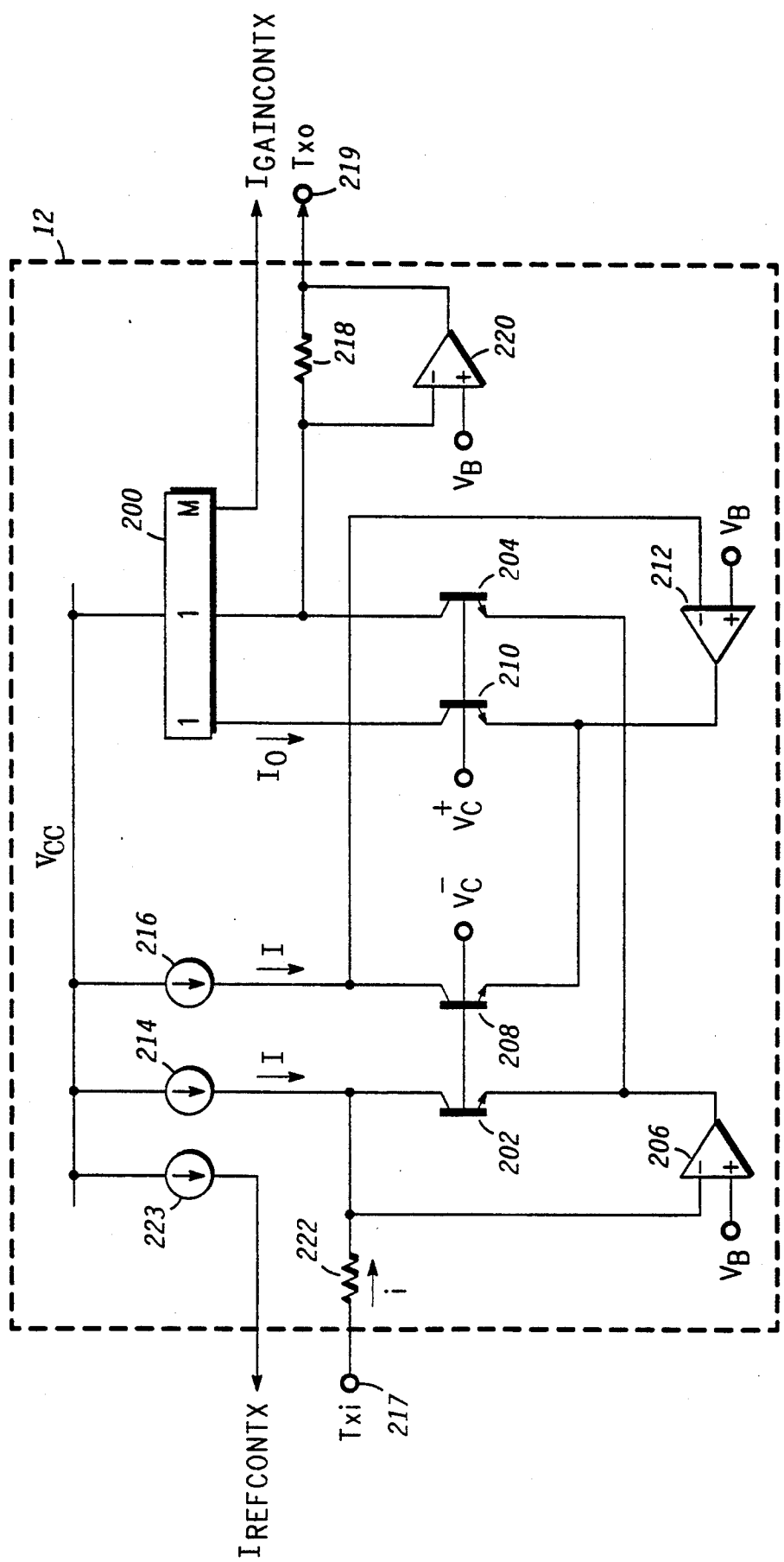
FIG. 3 is a simplified schematic diagram illustrating an attenuator for a speakerphone.

Referring now to FIG. 3 there is illustrated a simplified schematic of Tx attenuator 12. It is understood that Rx attenuator 14 is identical in structure and function to attenuator 12 except that the polarity of control voltages $V_{C+}$ and $V_{C-}$ supplied thereto are reversed and that currents $I_{REFCONTx}$ and $I_{GAINCONRx}$ as labelled in FIG. 3 would become currents $I_{REFCONRx}$ and $I_{GAINCONRx}$ for the receive attenuator.

Tx attenuator 12 includes emitter coupled transistor pair 202 and 204 and emitter coupled transistor pair 208 and 210 wherein the bases of transistors 202 and 208 are coupled to receive control voltage $V_{C-}$ and the bases of transistors 204 and 210 are coupled to receive control voltage $V_{C+}$. The emitters of transistors 202 and 204 are coupled to an output of operational amplifier (op amp) 206 while the collector of transistor 202 is coupled to the inverting input of op amp 206. Likewise, the emitters of transistors 208 and 210 are coupled to an output of operational amplifier (op amp) 212 while the collector of transistor 208 is coupled to the inverting input of op amp 212. The non-inverting inputs of op amps 206 and 212 are coupled to receive bias voltage $V_B$. Current sources 214 and 216 both provide bias current I respectively at the collectors of transistors 202 and 208. Current mirror 200 has an input coupled to the collector of transistor 210 and a first output coupled to the collector of transistor 204. Terminal 217, which is the input of Tx attenuator 12, is coupled through resistor 222 to the collector of transistor 202. Similarly, terminal 219, which is the output of Tx attenuator 12, is coupled through resistor 218 to the collector of transistor 204. Op amp 220 has an inverting input coupled to the collector of transistor 204 and an output coupled to terminal 219. The non-inverting input of op amp 220 is coupled to receive bias voltage $V_B$. Finally, current source 223 provides bias current $I_{REFCONTx}$ while the second output of current mirror 200 provides output current $I_{GAINCONTx}$. It is worth noting that bias current $I_{REFCONTx}$ is typically substantially equal to current I wherein both currents would be generated via current mirrors.

In operation, transistors 202 and 204 in conjunction with operational amplifier 206 comprise a log-antilog amplifier as do transistors 208, 210 and operational amplifier 212. For given control voltages VC+ and VC−, op amps 206 and 212 will sink current I to ensure that proper voltages appears across the base-emitter junctions of transistors 202 and 208, respectively. These base-emitter voltages are logarithmic functions of the current I as is well understood from the relationship of collector current to $V_{BE}$ voltage of a bipolar transistor.

With the emitter voltages of transistors 202 and 208 set and since transistor pair 202 and 204 as well as transistor pair 208 and 210 are emitter coupled, the voltages at the emitters of transistors 204 and 210 are substantially equal to the voltages at the emitters of transistors 202 and 208, respectively. This sets a voltage across the base-emitter of transistor 204 which is determined by control voltage VC+ and the emitter voltage of transistor 204. Likewise, a voltage is set across the base-emitter of transistor 210 which is determined by control voltage VC+ and the emitter voltage of transistor 210. Further, it is understood that the base-emitter voltages of transistors 204 and 210 are substantially equal to one another, and depending on the relative control voltages $V_{C+}$ and $V_{C-}$, the base-emitter voltages of transistors 204 and 210 can be either less than, equal to, or greater than the base-emitter voltages of transistors 202 and 208. As a result, current $I_O$ is generated which is the antilog of the base-emitter voltage across transistor 210. Thus, the relationship of current $I_O$ to current I can be expressed as:

$$I_O = I \times \exp[(V_{C+} - V_{C-})/V_T] \quad (1)$$

where $V_T$ is the thermal voltage (KT/q).

A current substantially equal to current $I_O$ is also generated by the identical base-emitter voltage across transistor 204. Further, current $I_O$ drives the input of current mirror 200 and is sourced at the first output of current mirror 200 to the collector of transistor 204. Since the current at the first output of mirror 200 is equal to the current at collector 204, no DC current flows through resistor 218 and, thus, to output terminal 219.

In the presence of an AC signal applied to the input of attenuator 12, an AC current, denoted by i, is generated and flows through resistor 222. AC current i adds to DC current I at the collector of transistor 202 thereby creating a current at the first output of current mirror 200 which includes both a DC and an AC portion. The operation of attenuator 12 with AC current i is identical to the aforementioned description for DC current I wherein the AC current at the first output of current mirror 200 ($i_{CM200}$) can be expressed as:

$$i_{CM200} = i \times \exp[(V_{C+} - V_{C-})/V_T] \quad (2)$$

Thus, as a result, the DC current appearing at the first output of current mirror 200 is sunk by the collector of transistor 204 while the AC current ($i_{CM200}$) at the first output of current mirror 200 flows through resistor 218. The total voltage gain (Txo/Txi) of attenuator 12 from TXI to TXO can be expressed as:

$$Txo/Txi = (R_{218}/R_{222}) \times \exp[(V_{C+} - V_{C-})/V_T] \quad (3)$$

Thus, from Eqn. 3, one can easily see that as control voltage $V_{C+}$ increases with respect to control voltage $V_{C-}$, the gain of Tx attenuator 12 increases. Further, it should be realized that for Rx attenuator 14, as control voltage $V_{C-}$ increases with respect to control voltage $V_{C+}$, the gain of Rx attenuator 12 increases since the polarity of the control voltage was reversed as aforementioned.

Further, since currents I and $I_{REFCONTx}$ are typically generated from the same current mirrors and are of equal value, current $I_O$ can be expressed as a function of current $I_{REFCONTx}$ as shown in Eqn. 4.

$$I_O = I_{REFCONTx} \times \exp[(V_{C+} - V_{C-})/V_T] \quad (4)$$

Thus, from the above equations, one can easily see that current $I_O$ increases as the gain of Tx attenuator 12 increases. Further, since the second output of current mirror 200 provides a current of M times the current $I_O$, current $I_{GAINCONTx}$ also increases as the gain of Tx attenuator 12 increases.

Figure 4:
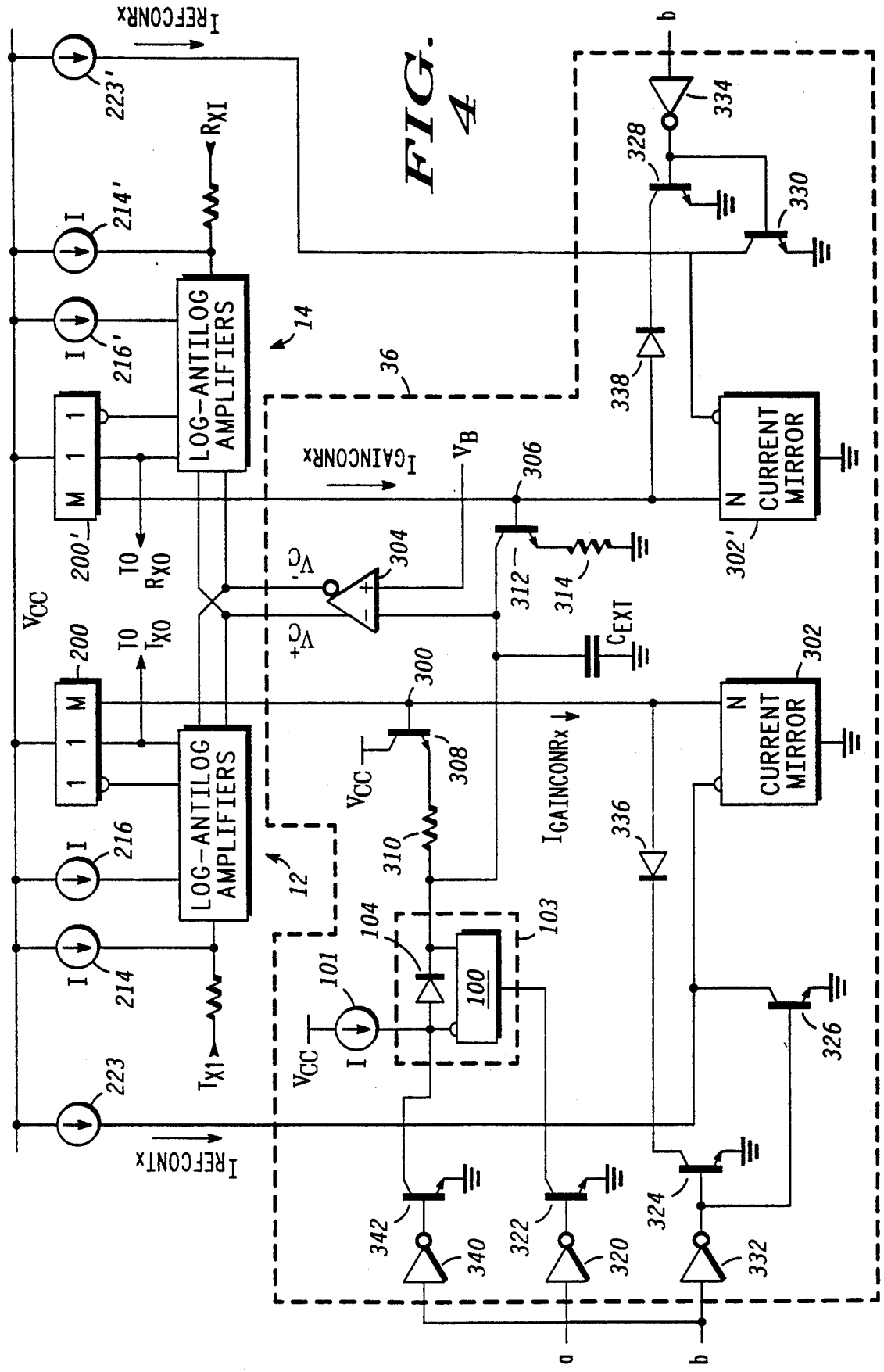
FIG. 4 is a partial block and schematic diagram illustrating a DC control loop of a speakerphone.

For good gain control of attenuators 12 and 14, control voltage $V_{C+}$ and $V_{C-}$ must be precise. Thus, a DC control loop is provided for generating control voltages $V_{C+}$ and $V_{C-}$ accurately without the need for precise voltage references. Turning now to FIG. 4, the attenuator control loop for setting the gain of attenuators 12 and 14 to a predetermined maximum value is described. It is to be understood the components of FIG. 4 corresponding to like components of FIGS. 1, 2 and 3 are referenced by like numbers. In addition, components of Rx attenuator 14 corresponding to like components of Tx attenuator 12 are referenced by prime numbers.

The DC control loop portion for controlling Tx attenuator 12 includes the M ratioed output of current mirror 200 which sources DC current $I_{GAINCONTx}$ to node 300. Current mirror 302 having an output coupled to node 300 will sink a current therefrom having a value that is N times the current supplied to the input of current mirror 302 which is current $I_{REFCONTx}$. Similarly, DC control loop portion controlling Rx attenuator 14 comprises the M output of current mirror 200' connected to node 306 to which the output of current mirror 302' is coupled. The input of current mirror 302' is coupled to receive current $I_{REFCONRx}$. Current mirror 100 has an input coupled to receive current I from current source 101 whereby current source 101 is coupled between operating potential $V_{CC}$ and the input of current mirror 100. The output of current mirror 100 is coupled to the input of current mirror 100 by diode 104 wherein diode 104 and current mirror 100 comprise bi-directional current mirror 103. Transistor 308 has a base coupled to node 300 and a collector coupled to receive operating potential $V_{CC}$. The emitter of transistor 308 is coupled to the output of bi-directional current mirror 103 through resistor 310. Transistor 312 has a base coupled to node 306 and an emitter returned to ground through resistor 314. The collector of transistor 312 and the output of bi-directional current mirror 103 are coupled to a first input of differential amplifier (diff amp) 304. The second input of diff amp 304 is coupled to receive bias voltage $V_B$. The first and second outputs of diff amp 304 respectively provide control voltages $V_{C+}$ and $V_{C-}$ to Tx attenuator 12 and to Rx attenuator 14 wherein the polarity applied to Rx attenuator 14 is reversed with respect to the polarity of Tx attenuator 12, as aforedescribed. In addition, an external capacitor ($C_{ext}$) is typically coupled between the first input of diff amp 304 and ground reference.

In the transmit mode of operation, bi-directional current mirror 103 sinks current from the first input of diff amp 304 to discharge capacitor $C_{ext}$ thereby increasing voltage $V_{C+}$ with respect to voltage $V_{C-}$. As voltage $V_{C+}$ becomes positive, the gain of Tx attenuator 12 increases to a maximum value while the gain of Rx attenuator 14 is minimized thereby determining the attenuation range. Likewise, as voltage $V_{C-}$ increases with respect to $V_{C+}$, the gain of Rx attenuator 14 increases to a maximum value while the gain of Tx attenuator 12 is minimized thereby obtaining the same attenuator range. Further, as the gain of Tx attenuator increases, the magnitude of current $I_{GAINCONTx}$ from the second output of current mirror 200 which is sourced to node 300 also increases proportionally until it substantially equals the magnitude of a predetermined current sunk by current mirror 302 which is N times current $I_{REFCONTx}$. Thereafter, transistor 308 will be turned on since base current is supplied to transistor 308 which then provides for sourcing current via resistor 310 to the first input of diff amp 304 thereby preventing further discharge of capacitor $C_{ext}$. Control voltages $V_{C+}$ and $V_{C-}$ are therefore set to the proper values to ensure the proper maximum gain of attenuator 12 and the corresponding minimum gain of attenuator 14.

Now analyzing the receive mode of operation, current is sourced from bi-directional current mirror 103 to raise the voltage at the first input of diff amp 304 thereby increasing voltage $V_{C-}$ with respect to $V_{C+}$. The gain of Rx attenuator 14 will then begin increasing until the value of current $I_{GAINCONRx}$, which is sourced from the second output of current mirror 200', equals the current sunk by current mirror 302' which is substantially equal to N times current $I_{REFCONRx}$. Thereafter transistor 312 is rendered conductive by excess current being supplied to the base thereof to sink current to circuit ground via resistor 314. This will maintain the voltage at the first input of diff amp 304 substantially constant.

In summary, the DC control loop shown in FIG. 4 maintains the current at the outputs of current mirrors 302 and 302' substantially equal to the current at the outputs of current mirrors 200 and 200', respectively, by varying control voltages $V_{C+}$ and $V_{C-}$. Further, control voltages $V_{C+}$ and $V_{C-}$ adjust the gains and currents $I_{GAINCONTx}$ and $I_{GAINCONRx}$, respectively, of attenuators 12 and 14. Thus, in the transmit mode, the gain of attenuator 12 and current $I_{GAINCONTx}$ are set to maximum values while the gain of attenuator 14 and current $I_{GAINCONRx}$ are set to minimum values. On the other hand, during the receive mode, the gain of attenuator 14 and current $I_{GAINCONRx}$ are set to maximum values while the gain of attenuator 12 and current $I_{GAINCONTx}$ are set to minimum values.

In addition, FIG. 4 shows some control circuitry which is responsive to output logic signals a and b of decode logic circuit 41. Assuming that signal b is a logic high and signal a is a logic low, then transistor 322 is rendered operative via signal a and inverter 320. Thus, current mirror 100 is enabled and allows bi-directional current mirror 103 to sink current from the first input of diff amp 304. This is indicative of speakerphone circuit 10 operating in the transmit mode as aforedescribed. However, if signal a is a logic high and signal b still being in a logic high state, then transistor 322 is rendered non-operative and current mirror 100 is disabled. Current is now sourced through diode 104 to the first input of diff amp 304. Therefore, bidirectional current mirror 103 operates to source current to the first input of diff amp 304. This is indicative of speakerphone circuit 10 operating in the receive mode as aforedescribed. Thus, if signal b is a logic high, signal a controls speakerphone circuit 10 to operate in the transmit mode or receive mode as shown in Table 1.

On the other hand, if signal b is a logic low, then currents $I_{REFCONTx}$, $I_{GAINCONTx}$, $I_{REFCONRx}$, and $I_{GAINCONRx}$ as well as current I of current source 101 are steered away from current mirrors 302 and 302' such that the gains of attenuators 12 and 14 are set to substantially equal values as indicative of the idle mode. This is accomplished by transistors 324, 326, 328, 330 and 342 being rendered operative via logic signal b and inverters 332, 334 and 340. Thus, when transistors 326 and 330 are rendered operative, currents $I_{REFCONTx}$ and $I_{REFCONRx}$, respectively, are steered away from current mirrors 302 and 302' and into transistors 326 and 330. Likewise, when transistors 324 and 328 are rendered operative, the voltage at the outputs of current mirrors 302 and 302' are clamped to a predetermined voltage thereby preventing saturation of the output transistors of current mirrors 302 and 302' (not shown). Further, when transistor 342 is rendered operative, current mirror 100 is disabled by removing its input current I supplied from current source 101. This allows the first input of diff amp 304 to become substantially equal to voltage $V_B$ which is applied to the second input of diff amp 304 thereby setting control voltages $V_{C+}$ and $V_{C-}$ to provide for substantially equal gains of attenuators 12 and 14.

Figure 5:
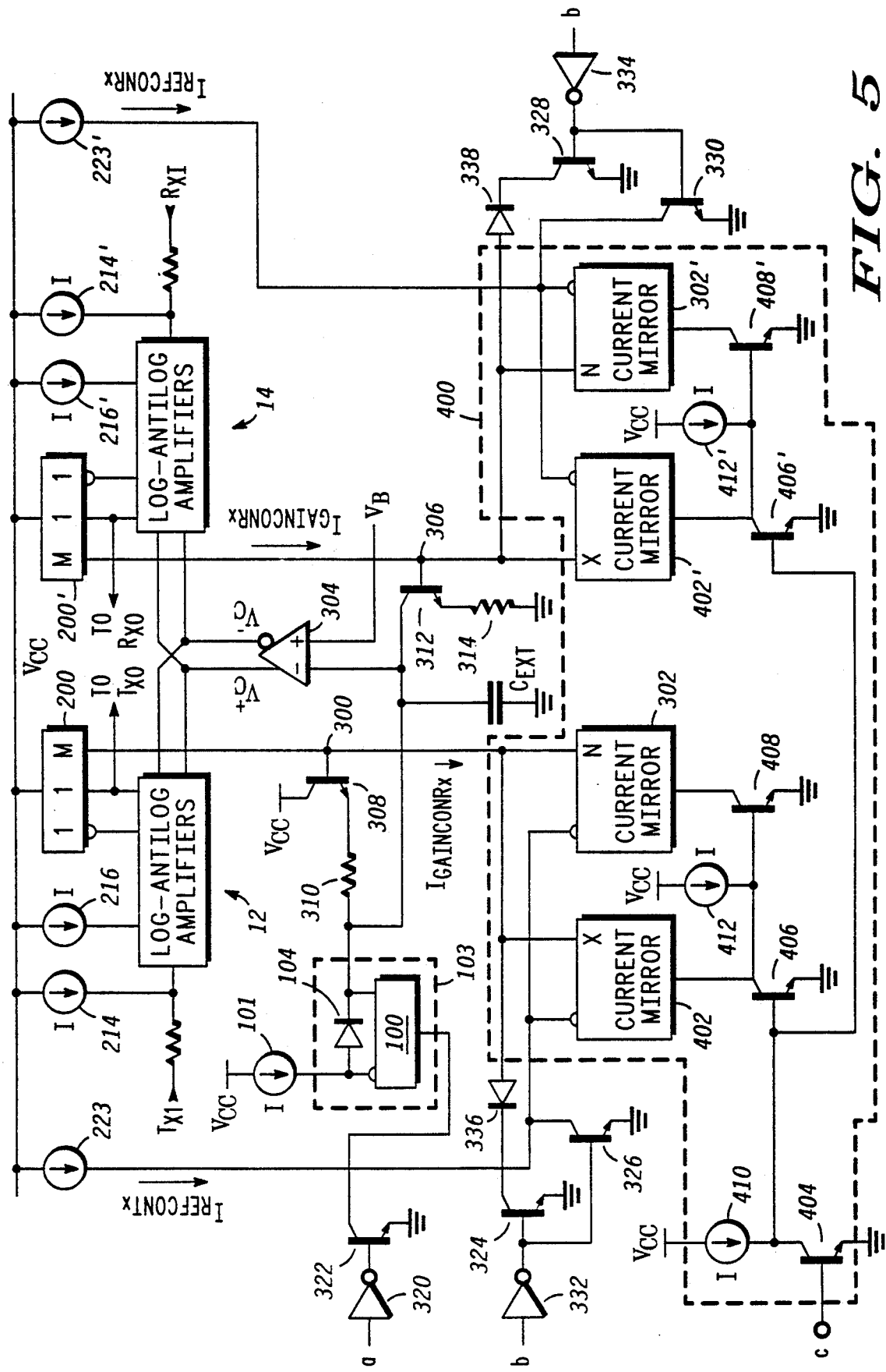
FIG. 5 is a partial block and schematic diagram illustrating a DC control loop of a speakerphone having an attenuator range control circuit in accordance with the present invention.

Referring to FIG. 5, a partial block and schematic diagram illustrating a DC control loop of a speakerphone having attenuator range control circuit 400 is shown. It is understood that components similar to those of FIGS. 1–4 are indicated by like reference numbers. Attenuator range control circuit 400 includes current mirrors 302 and 302' and current mirrors 402 and 402' which like current mirrors 302 and 302' have their inputs respectively coupled to receive currents $I_{REFCONTx}$ and $I_{REFCONRx}$, and their outputs respectively coupled receive currents $I_{GAINCONTx}$ and $I_{GAINCONRx}$. Attenuator range control circuit 400 also comprises a switching circuit which includes transistor 404 which has a base coupled to receive logic signal c and an emitter returned to ground. The collector of transistor 404 is coupled to the bases of transistors 406 and 406'. The collectors of transistors 406 and 406' are respectively coupled to the reference terminals of current mirrors 402 and 402'. In addition, the collectors of transistors 406 and 406' are also respectively coupled to the bases of transistors 408 and 408'. The collectors of transistors 408 and 408' are respectively coupled to the reference terminals of current mirrors 302 and 302'. The emitters of transistors 406, 406', 408 and 408' are all returned to ground. Current source 410 is coupled between operating potential $V_{CC}$ and the collector of transistor 404. Further, current sources 412 and 412' are coupled between operating potential $V_{CC}$ and the collectors of transistors 406 and 406', respectively.

In operation, when signal c is in a logic low state, transistor 404 is rendered non-operative thereby rendering transistors 406 and 406' operative. Further, transistors 408 and 408' are rendered non-operative. As a result, current mirrors 402 and 402' are enabled while current mirrors 302 and 302' are disabled.

On the other hand, when signal c switches to a logic high state, transistor 404 is rendered operative thereby rendering transistors 408 and 408' operative. Further, transistors 406 and 406' are rendered non-operative. As a result, current mirrors 302 and 302' are enabled while current mirrors 402 and 402' are disabled. Thus, logic signal c alternately enables current mirrors 302 and 302' or current mirrors 402 and 402'. It must be realized that current mirrors 402 and 402' have a different gain (denoted by X) than current mirrors 302 and 302' which have a gain of N as aforementioned. Further, the gain of current mirrors 402 and 402' can be less than unity as well as greater than unity.

As an example of the operation of attenuation range control circuit 400, assume that signal c is in a logic high state and, thus, current mirrors 302 and 302' are active. Further, assume that speakerphone circuit 10 is currently in the transmit mode and, thus, the gain of transmit attenuator 12 is at a maximum value and the gain of receive attenuator 14 is at a minimum value. As a result, current $I_{GAINCONTx}$ is set to a maximum value and current $I_{GAINCONRx}$ is set to a minimum value, as aforedescribed. Also assume that the gain of current mirrors 402 and 402' is less than the gain of current mirrors 302 and 302', i.e., $N > X$. When signal c switches to a logic low state, current mirrors 402 and 402' are now enabled and current mirrors 302 and 302' are disabled. It must be realized that since the gain of current mirrors 402 and 402' is less than the gain of current mirrors 302 and 302', current $I_{GAINCONTx}$ is now larger than the current sunk at the output of current mirror 402. As a result, the excess current flows into the base of transistor 308 thereby charging up the voltage at the first input of diff amp 304. Further, if the voltage at the first input of diff amp 304 increases, control voltage $V_{C+}$ is decreased with respect to control voltage $V_{C-}$ thereby decreasing the gain of attenuator 12 and increasing the gain of attenuator 14, as aforedescribed. Since the gain of attenuators 12 and 14 have been respectively decreased and increased, currents $I_{GAINCONTx}$ and $I_{GAINCONRx}$ will also be respectively decreased and increased. Thus, the DC control loop, as aforedescribed for FIG. 4, will eventually adjust control voltages $V_{C+}$ and $V_{C-}$ such that currents $I_{GAINCONTx}$ and $I_{GAINCONRx}$ satisfy current mirrors 402 and 402'. It is important to realize now that $I_{GAINCONTx}$ and $I_{GAINCONRx}$ are respectively set to new maximum and minimum values by switching to current mirrors 402 and 402' wherein the current $I_{GAINCONTx}$ is less than it was when using current mirror 302. Likewise, current $I_{GAINCONRx}$ is larger than it was when using current mirror 302'. Further, it should be realized that by reducing the minimum and maximum differential values between currents $I_{GAINCONTx}$ and $I_{GAINCONRx}$, the overall attenuation range of attenuators 12 and 14 has also been reduced. In summary, by switching current mirrors within the DC control loop of speakerphone circuit 10, the attenuation range of speakerphone circuit 10 can be varied. Further, it is worth noting that FIG. 5 only shows two pairs of current mirrors. However, with the proper logic signals, it is understood that any number of current mirror pairs could be switched in to provide a plurality of attenuation ranges for speakerphone circuit 10. Further, it is understood that these attenuation ranges can be both greater than as well as less than a nominal range.

Figure 6:
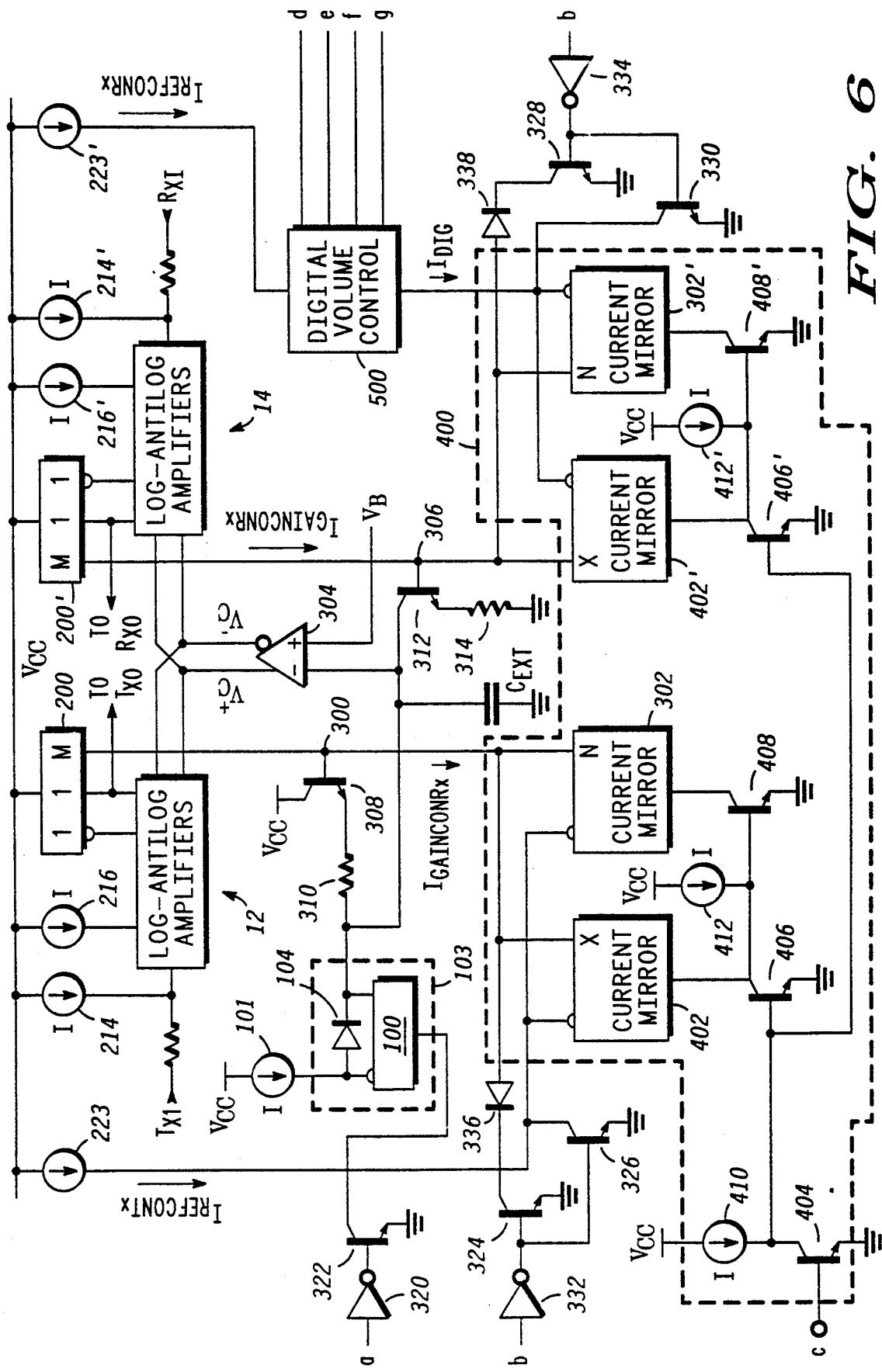
FIG. 6 is a partial block and schematic diagram illustrating a DC control loop of a speakerphone having a digital volume control circuit.
Figure 7:
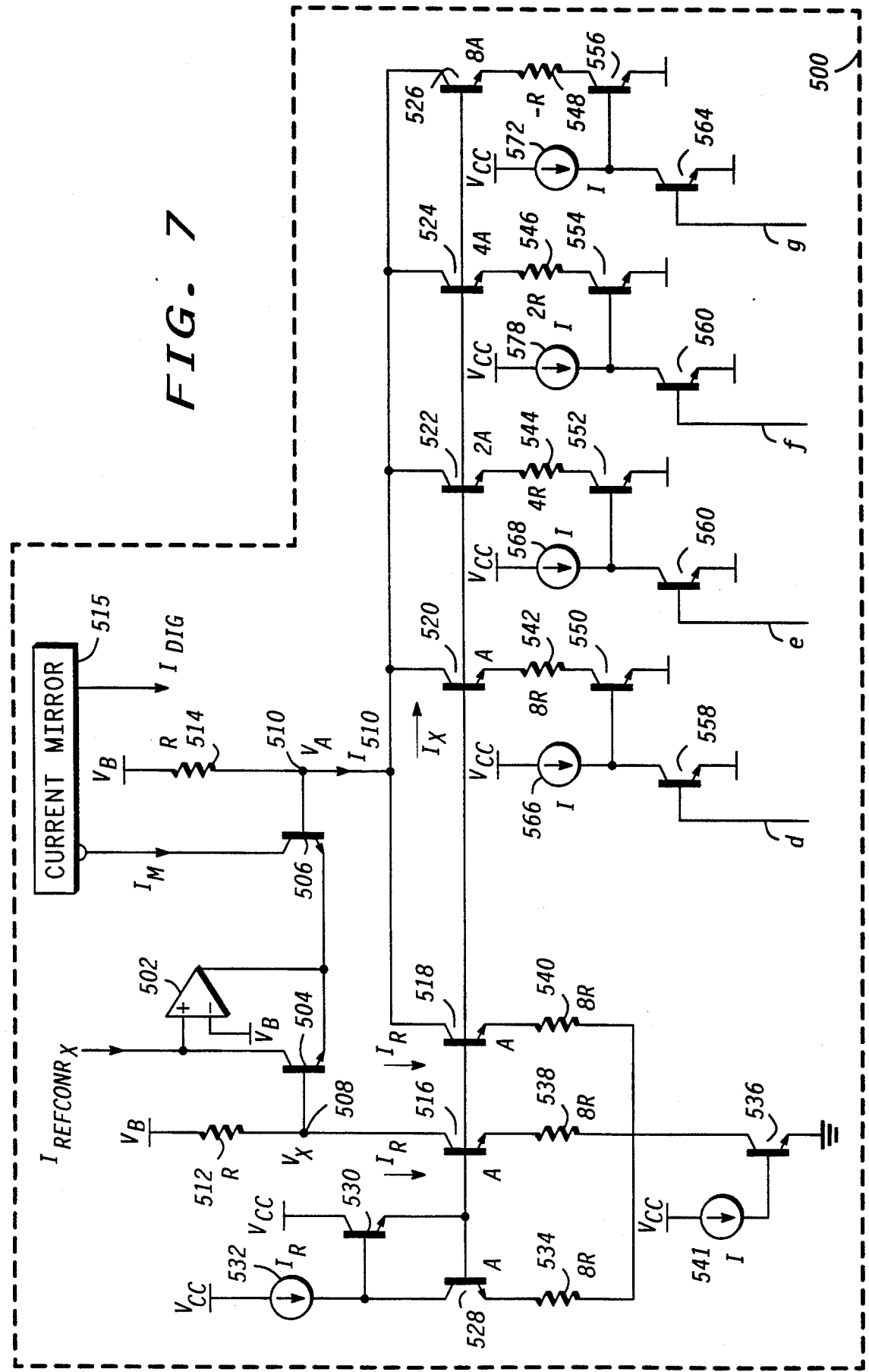
FIG. 7 is a simplified schematic diagram illustrating a digital volume control circuit for a speakerphone.

Referring to FIG. 6, a partial block and schematic diagram illustrating a DC control loop of a speakerphone having digital volume control circuit 500 is shown. It is understood that components similar to those of FIGS. 1–5 are indicated by like reference numbers. Digital volume control circuit 500 is coupled between current source 223' and the inputs of current mirrors 302' and 402' such that digital volume control circuit 500 receives current $I_{REFCONRx}$ and, in response to logic signals d–g, provides output current $I_{DIG}$ which is equal to a predetermined amount of current $I_{REFCONRx}$. Turning now to FIG. 7, digital volume control circuit 500 is shown which includes operational amplifier (op amp) 502 having an inverting input coupled to an input of digital volume control circuit 500 for receiving signal $I_{REFCONRx}$. The non-inverting input of op amp 502 is coupled to receive bias voltage $V_B$ while the output of op amp 502 is coupled to the common emitters of transistors 504 and 506. The bases of transistors 504 and 506 are respectively coupled to circuit nodes 508 and 510. Resistor 512 is coupled between bias voltage $V_B$ and circuit node 508. Likewise, resistor 514 is coupled between bias voltage $V_B$ and circuit node 510 wherein the value of resistors 512 and 514 are substantially equal and denoted by value R. The collector of transistor 504 is coupled to the inverting input of op amp 502 while the collector of transistor 506 is coupled to an input of current mirror 515. The output of current mirror 515 is coupled to an output of digital volume control circuit 500 for providing signal $I_{DIG}$. Circuit node 508 is coupled to the collector of transistor 516 while circuit node 510 is coupled to the common collectors of transistors 518, 520, 522, 524 and 526. The common bases of transistors 516, 518, 520, 522, 524 and 526 are all coupled to the base of transistor 528 and to the emitter of transistor 530. The collector of transistor 528 and the base of transistor 530 are coupled through current source 532 to operating potential $V_{CC}$. The emitter of transistor 528 is coupled through resistor 534 to the collector of transistor 536. Likewise, the emitters of transistors 516 and 518 are respectively coupled through resistors 538 and 540 to the collector of transistor 536. The base of transistor 536 is coupled through current source 541 to operating potential $V_{CC}$ while the emitter of transistor 536 is returned to ground. The emitters of transistors 520, 522, 524 and 526 are respectively coupled through resistors 542, 544, 546 and 548 to the collectors of transistors 550, 552, 554 and 556, respectively. The emitters of transistors 550, 552, 554 and 556 as well as the emitters of transistors 558, 560, 562 and 564 are all returned to ground. The bases of transistors 550, 552, 554 and 556 are respectively coupled to the collectors of transistors 558, 560, 562 and 564. The bases of transistors 558, 560, 562 and 564 are coupled to a plurality of inputs of digital volume control circuit 500 for respectively receiving logic signals d, e, f and g. Current sources 566, 568, 570 and 572 are coupled between operating potential $V_{CC}$ and the collectors of transistors 558, 560, 562 and 564, respectively.

In operation, transistors 528, 530 and 536 along with current sources 532 and 541 and resistor 534 provide predetermined current $I_R$ through transistors 516 and 518. Since current $I_R$ flows through transistor 516, predetermined voltage $V_X$ is generated at circuit node 508 via voltage $V_B$ and the voltage drop across resistor 512. In a similar manner, voltage $V_A$ is generated at circuit node 510 via voltage $V_B$ and the voltage drop across resistor 514. However, it must be realized that voltage $V_X$ is substantially constant, but voltage $V_A$ will vary since current $I_{510}$ is a function of $I_X$ which will vary as a function of logic signals d-g as will be described hereinafter. Further, from simple circuit analysis, the following equation can be derived for current $I_M$.

$$I_M = I_{REFCONRx} \times e^{[(V_A - V_X)/V_T]} \quad (5)$$

From Eqn. 5, one can easily see that for $V_A = V_X$, $I_M = I_{REFCONRx}$. However, as $V_A$ decreases, current $I_M$ will decrease and fall below current $I_{REFCONRx}$. Further, since current $I_{DIG}$ is a mirrored version of current $I_M$, current $I_{DIG}$ will also decrease as voltage $V_A$ decreases. Therefore, it should be realized that as current $I_X$ increases, current $I_{510}$ correspondingly increases thereby decreasing voltage $V_A$. Thus, by varying current $I_X$ linearly, current $I_{DIG}$ can be varied. Further, with reference to FIG. 6, it must be realized that as current $I_{DIG}$ varies, the current flowing into the input of current mirror 302' if logic signal c is high (or 402' if logic signal c is low) also varies. This, as aforedescribed, will have the effect of varying current $I_{GAINCONRx}$ and, thus, varying the gain of receive attenuator 14 thereby providing volume control for speakerphone circuit 10.

Turning back to FIG. 7, it will now be shown how logic signals d-g can vary the value of current $I_X$. First assume that logic signals d-g are all at a logic high voltage level which will render transistors 558, 560, 562 and 564 operative and transistors 550, 552, 554 and 556 non-operative. Therefore, substantially zero current will flow through transistors 520, 522, 524 and 526 and current $I_X$ will be substantially equal to zero. This will allow current $I_{510}$ to be substantially equal to current $I_R$ and voltage $V_A$ = voltage $V_X$. Thus, $I_{DIG} = I_{REFCONRx}$ and speakerphone circuit 10 is operating at full volume.

Now assume that logic signal d is a logic low while logic signals e-g are still at logic high voltage levels.

This will render transistors 550 and 520 operative and allow current $I_R$ to flow through transistors 520 and 550. It should be realized that current $I_R$ flows through transistor 520 since area A of transistor 520 is matched to area A of transistors 516 and 518. Current $I_X$ is now equal to current $I_R$ and, thus, increasing current $I_{510}$ by $I_R$. This will have the effect of decreasing voltage $V_A$ by a predetermined amount and, thus, decreasing current $I_{DIG}$ by a predetermined amount.

It should now be realized that if logic signal e is at a logic low, transistors 522 and 552 are rendered operative and substantially two times current $I_R$ ($2I_R$) flows through transistor 522 thereby increasing current $I_{510}$ by $2I_R$. Current $2I_R$ flows through transistor 522 since the area of transistor 522 is two times the area (A) of transistors 516 and 518. Likewise, if logic signals f and g are at logic lows, transistors 524 and 526, respectively, will be rendered operative with corresponding currents $4I_R$ and $8I_R$, respectively, flowing therethrough since the area of transistors 524 and 526 are respectively four times and eight times the area of transistors 516 and 518. Thus, logic signals d-g generate binary weighted currents flowing through transistors 520, 522, 524 and 526, respectively, wherein logic signal d corresponds to the least significant bit (LSB) and logic signal g corresponds to the most significant bit (MSB). Further, these binary weighted currents will vary the value of current $I_{510}$ and voltage $V_A$ thereby varying current $I_{DIG}$. Thus, for each LSB change in logic signals d-g, there will be a linear change in voltage $V_A$ and a corresponding exponential change in current $I_{DIG}$. Further, this exponential change in current $I_{DIG}$ will subsequently result in a dB change in the gain of receive attenuator 14 wherein the dB change in the gain for each corresponding LSB change is substantially equal. Thus, a linear change in voltage $V_A$ results in a linear dB change in the gain of receive attenuator 14. It is also worth noting that if currents $I_R$ and $I_{REFCONTx}$ are generated by similar means, then the gain of receive attenuator 14 is substantially independent of temperature. Further, it should be apparent from the foregoing that logic signals d-g being all low corresponds to a maximum value for current $I_X$ and a minimum volume for speakerphone circuit 10 while logic signals d-g being all high corresponds to a minimum value for current $I_X$ and a minimum volume for speakerphone circuit 10.

By now it should be apparent that a novel speakerphone circuit has been provided which includes an adjustable gain range current mirror circuit for controlling the attenuation range of the speakerphone. Further, it should also be apparent that a digital volume control has been provided for a speakerphone circuit which provides an equal dB change in the gain of an attenuator for each least significant bit change in the digital volume control.

I claim:

1. A direct current (DC) control loop for adjusting the gain range of an attenuator circuit wherein the gain of the attenuator circuit is varied in response to a control voltage applied thereto, comprising:

an amplifier circuit for providing the control voltage and including a charge storage means, the magnitude of the control voltage varying as the charge across said charge storage means is varied;

first circuit means having an output for providing a current which has a magnitude that is proportional to the gain of the attenuator circuit;

an attenuation range control circuit having an input and an output, said input of said attenuation range control circuit being coupled to receive a bias current, said output of said attenuation range control circuit being coupled to said output of said first circuit means for sinking a current, said attenuation range control circuit including:
  a plurality of current mirrors, each one of said plurality of current mirrors having an input terminal, an output terminal and a reference terminal, said input terminals of each one of said plurality of current mirrors being coupled said input of said attenuation range control circuit, said output terminals of each one of said plurality of current mirrors being coupled to said output of said attenuation range control circuit; and
  control circuit means, coupled to said reference terminals of each one of said plurality of current mirrors, for alternately rendering said plurality of current mirrors operative, each one of said plurality of current mirrors providing a predetermined gain of said current sank at said output of said attenuation range control circuit with respect to said bias current; and
second circuit means responsive to said current provided by said first circuit means becoming equal to said current sank by said output of said attenuation range control circuit for maintaining the charge across said charge storage means wherein the gain range of the attenuator circuit is determined by which one of said plurality of current mirrors is operative.

2. The circuit according to claim 1 wherein said plurality of current mirrors of said attenuation range control circuit includes:
  a first current mirror circuit having an input terminal, an output terminal and a reference terminal, said input terminal of said first current mirror circuit being coupled to said input of said attenuation range control circuit, said output terminal of said first current mirror circuit being coupled to said output of said attenuation range control circuit, and said reference terminal of said first current mirror circuit being coupled to a first transistor of said control circuit means; and
  a second current mirror circuit having an input terminal, an output terminal and a reference terminal, said input terminal of said second current mirror circuit being coupled to said input of said attenuation range control circuit, said output terminal of said second current mirror circuit being coupled to said output of said attenuation range control circuit, and said reference terminal of said second current mirror circuit being coupled to a second transistor of said control circuit means.

3. The circuit according to claim 2 wherein said control circuit means of said attenuation range control circuit includes:
  a third transistor having a collector, a base and an emitter, said base being coupled to receive a control logic signal, and said emitter being coupled to a first supply voltage terminal;
  said first transistor having a collector, a base and an emitter, said collector of said first transistor being coupled to said reference terminal of said first current mirror circuit, said base of said first transistor being coupled to said collector of said third transistor, and said emitter of said first transistor being coupled to said first supply voltage terminal; and
  said second transistor having a collector, a base and an emitter, said collector of said second transistor being coupled to said reference terminal of said second current mirror circuit, said base of said second transistor being coupled to said collector of said first transistor, and said emitter of said second transistor being coupled to said first supply voltage terminal;
  a first current source coupled between a second supply voltage terminal and said collector of said third transistor; and
  a second current source coupled between said second supply voltage terminal and said collector of said first transistor.

4. The DC control loop according to claim 3 wherein said first circuit means includes a first current mirror circuit having an input from which a current proportional to the gain of the attenuator circuit is sunk and an output for sourcing said current at said output of said first circuit means, said current sourced from said output of said first circuit means being a function of said current sunk by said input of said first current mirror circuit of said first circuit means.

5. The DC control loop according to claim 4, wherein said second circuit means is a transistor having an emitter coupled to said charge storage means, a collector coupled to said first supply voltage terminal and a base coupled both to said outputs of said first current mirror circuit of said first circuit means and said attenuation range control circuit.

6. The DC control loop according to claim 4 wherein said second circuit means is a transistor having an emitter coupled to said second supply voltage terminal, a collector coupled to said charge storage means and a base coupled both to said outputs of said first current mirror circuit of said first circuit means and said attenuation range control circuit.

7. A speakerphone including a transit attenuator, a receive attenuator and an amplifier circuit for providing a control voltage for varying the gains of the transmit and receive attenuators in a complementary manner, the amplifier circuit including charge storage means for varying the magnitude of the control voltage as the charge across the charge storage means is varied, comprising:
  a DC control loop coupled between a respective output of each of the attenuators and the amplifier circuit, said DC control loop including an attenuation range control circuit for determining an overall attenuation range of the transmit and receive attenuators, said attenuation range control circuit of said DC control loop including:
    first and second current mirrors, each having an input terminal, an output terminal and a reference terminal, said input terminals of said first and second current mirrors being coupled to receive a first bias current, said output terminals of said first and second current mirrors being coupled to said output of said current mirror circuit of said transmit attenuator for sinking a first predetermined current;
    third and fourth current mirrors, each having an input terminal, an output terminal and a reference terminal, said input terminals of said third and fourth current mirrors being coupled to receive a second bias current, said output terminals of said third and fourth current mirrors being coupled to said output of said current mirror circuit of said receive attenuator for sinking a second predetermined current; and a switching circuit coupled to said reference terminals of said first, second, third and fourth current mirrors for alternately rendering said first and third current mirrors and said second and fourth current mirrors operative wherein said overall attenuation range of said transmit and receive attenuators is determined by which current mirrors of said attenuation range control circuit are rendered operative.

8. The speakerphone according to claim 7 wherein the transmit attenuator includes a current mirror circuit having an output for supplying a DC current the magnitude of which is proportional to the gain of the transmit attenuator and wherein the receive attenuator includes a current mirror circuit having an output for supplying a DC current the magnitude of which is proportional to the gain of the receive attenuator.

9. The speakerphone according to claim 7 wherein said DC control loop further includes:

a first transistor which is rendered conductive in response to said DC current from said output of said current mirror of said transmit attenuator equaling said first predetermined current sank by said first or second current mirrors of said attenuation range control circuit for maintaining the charge across said charge storage means; and a second transistor which is rendered conductive in response to said DC current from said output of said current mirror of said receive attenuator equaling said second predetermined current sank by said third or fourth current mirrors of said attenuation range control circuit for maintaining the charge across said charge storage means.

10. The speakerphone according to claim 7 further including a volume control circuit responsive to a plurality of control signals and coupled between said receive attenuator and said DC control loop for providing a first current to said DC control loop, said first current of said volume control circuit being a predetermined portion of a bias current.

11. The speakerphone according to claim 10 wherein said volume control circuit includes:

first circuit means for providing a reference current and a reference voltage;

second circuit means for providing a second current and a first voltage wherein the magnitude said first current is determined by said plurality of control signals and the magnitude of said first voltage is determined by the difference of said reference current and said second current;

third circuit means having an input and an output for providing a third current, said third current being a function of the difference of said reference voltage and said first voltage, said input of said third circuit means coupled to receive said bias current of said receive attenuator; and a current mirror circuit having an input and an output, said input of said current mirror circuit of said third means being coupled to said output of said third circuit means, said output of said current mirror circuit of said third means providing said first current to said DC control loop.

* * * * *